United States Patent
Uemura (10) Patent No.: US 8,643,146 B2
(45) Date of Patent: Feb. 4, 2014

(54) SEMICONDUCTOR DEVICE

(75) Inventor: Hitoshi Uemura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 365 days.

(21) Appl. No.: 13/158,585

(22) Filed: Jun. 13, 2011

(65) Prior Publication Data

US 2012/0068310 A1 Mar. 22, 2012

(30) Foreign Application Priority Data

Sep. 22, 2010 (JP) ................. 2010-211874

(51) Int. Cl.
*H01L 29/66* (2006.01)
*H01L 29/02* (2006.01)

(52) U.S. Cl.
USPC ............. 257/577; 257/592; 257/E27.022; 257/E29.198; 257/170; 257/409

(58) Field of Classification Search
USPC ........... 257/577, 592, E27.022, E29.19, 170, 257/409, 452, 484, 605, E29.012; 438/140, 438/FOR. 230
See application file for complete search history.

(56) References Cited

U.S. PATENT DOCUMENTS

| | | | |
|---|---|---|---|
| 4,972,249 A | 11/1990 | Voboril | |
| 6,054,748 A | 4/2000 | Tsukuda et al. | |
| 2002/0096715 A1 | 7/2002 | Sumida et al. | |
| 2007/0215898 A1* | 9/2007 | Ozeki et al. | 257/139 |
| 2010/0224907 A1* | 9/2010 | Hara | 257/139 |

FOREIGN PATENT DOCUMENTS

| | | |
|---|---|---|
| DE | 102 03 479 A1 | 9/2002 |
| EP | 0 247 455 A1 | 12/1987 |
| JP | 4-162777 | 6/1992 |

OTHER PUBLICATIONS

Office Action issued on Jan. 14, 2013, in German patent Application No. 10 2011 083 230.0 with partial English translation.

* cited by examiner

*Primary Examiner* — Julio J Maldonado
*Assistant Examiner* — Moazzam Hossain
(74) *Attorney, Agent, or Firm* — Oblon, Spivak, McClelland, Maier & Neustadt, L.L.P.

(57) ABSTRACT

A carrier is prevented from being stored in a guard ring region in a semiconductor device. The semiconductor device has an IGBT cell including a base region and an emitter region formed in an n− type drift layer, and a p type collector layer arranged under the drift layer with a buffer layer interposed therebetween. A guard ring region having a guard ring is arranged around the IGBT cell. A lower surface of the guard ring region has a mesa structure provided by removing the collector layer.

3 Claims, 7 Drawing Sheets

SEMICONDUCTOR DEVICE

BACKGROUND OF THE INVENTION

1. Field of the Invention

The present invention relates to a structure of a semiconductor device and more particularly to an outer peripheral structure of a power control semiconductor device.

2. Description of the Background Art

A power control semiconductor device such as an IGBT (Insulated Gate Bipolar Transistor) has been widely used for commercial-off-the-shelf equipment to electric railroad purposes. While the IGBT has been developed to minimize its loss, withstanding capability expressed by use of a SOA (Safe Operating Area) as an indicator is lowered, in general. The SOA includes a RBSOA (Reverse Bias SOA). The RBSOA is the SOA when a reverse bias is applied to the IGBT, and it is an indicator of withstanding capability at the time of a turn-off operation. A technique to prevent the withstanding capability from being lowered has been required.

Meanwhile, Japanese Patent Application Laid-Open No. 4-162777 (1992) (FIGS. 1 and 5) discloses a configuration in which a planar guard ring having a mesa structure on its lower surface side is provided on an upper surface side of an outer peripheral part, and a glass film is provided on a bevel surface of the mesa structure as a protection film, in a reverse blocking thyristor. This configuration is made to solve a problem in double-sided planar structure that causes discharge between an end face of a silicon substrate and a substrate (support substrate) to support the silicon substrate with an electrode interposed therebetween, and a problem in double-sided mesa structure that lowers strength of a wafer.

A conventional IGBT has a laminated structure including a lifetime killer layer, an n type buffer layer, and a p type collector layer each having uniform impurity concentration provided under an n– type drift layer, on its lower surface side (collector side) including a cell region and a guard ring region provided on the outer side thereof. Thus, when the IGBT is turned on, holes are injected from the p type collector layer on the lower surface side into the n– type drift layer in the guard ring region as well as in the cell region.

Meanwhile, electrons are injected from an upper surface (emitter side) of the IGBT only from a MOSFET part in the cell region of the IGBT to the n– type drift layer, so that they are not injected from an upper surface in the guard ring region. Therefore, when the IGBT is in on state, holes and electrons are held in equilibrium in the n– type drift layer in the cell region and conductivity modulation is generated, but the holes remain in the n– type drift layer in the guard ring region.

When the IGBT is turned off after the on state, the electron injection from the upper surface side is stopped, the holes remaining in the n– type drift layer near the n type buffer layer are trapped by the lifetime killer layer, and the ones close to the upper surface is absorbed into a p type well (base region) having an emitter of the IGBT, and the rest disappear by its natural lifetime. Here, since the emitter is not provided on the upper surface side of the guard ring region, the holes provided close to the upper surface of the guard ring region try to intensively flow into the p type well of the IGBT cell provided in an outermost periphery in the cell region. At this time, when an amount of the holes absorbed into the p type well provided in the outermost periphery of the IGBT cell exceeds a certain value, thermal destruction is caused at that part, which lowers cutoff destruction withstand capability of the IGBT.

In addition, since the thyristor disclosed in the patent document 1 has a large effective area in a cell, there is no problem of the thermal destruction caused by current concentrated in an outer peripheral part of the cell.

Meanwhile, a PiN (p-intrinsic-n) diode having a cathode on the lower surface side of a substrate has the same problem as that of the IGBT. That is, when the diode is on state, holes are injected from a p type anode region on the upper surface side of a cell region and electrons are injected from an n type cathode layer on the lower surface side, into an n– type drift layer. At this time, electrons are injected from the n type cathode layer in the guard ring region similar to the cell region, so that a considerable amount of holes flows into the n– type drift layer in the guard ring region, from the cell region.

When the diode is turned off, the electrons stored in the n– type drift layer in the on state are discharged to the n type cathode layer, and the holes are discharged to the p type anode region. In addition, the electrons and holes are partially recombined and disappear. At this time, the holes stored in the n– type drift layer in the guard ring region try to intensively flow into the p type anode region provided in an outermost periphery in the cell region. As a result, reverse recovery current is concentrated in the outer peripheral part of the cell region, so that reverse recovery withstand capability is lowered in the diode.

In addition, since electric field intensity is concentrated in an upper surface of a substrate in a conventional guard ring structure (FLR: Field Limiting Ring), it is necessary to increase a width of a guard ring to prevent the electric field from being concentrated. However, the width of the outer peripheral structure is preferably small with a view to miniaturizing a device.

SUMMARY OF THE INVENTION

It is a first object of the present invention to prevent carriers from being accumulated in a guard ring region in a semiconductor device. In addition, it is a second object of the present invention to prevent an electric field from being concentrated in an upper surface of the guard ring region.

A semiconductor device according to a first aspect of the present invention includes a first semiconductor layer having a first conductivity type, a second semiconductor layer arranged under the first semiconductor layer and having a second conductivity type, an IGBT cell having a base region and an emitter region formed in the first semiconductor layer, and a collector layer provided as the second semiconductor layer, and a guard ring region provided around a cell region having the IGBT cell, and having a guard ring formed in the first semiconductor layer, wherein the second semiconductor layer has been removed from a lower part of the guard ring region.

A semiconductor device according to a second aspect of the present invention includes a first semiconductor layer having a first conductivity type, a second semiconductor layer arranged under the first semiconductor layer and having a second conductivity type, an IGBT cell having a base region and an emitter region formed in the first semiconductor layer, and a collector layer provided as the second semiconductor layer, and a guard ring region provided around a cell region having the IGBT cell, and having a guard ring formed in the first semiconductor layer, wherein the first semiconductor layer includes a drift layer, and a buffer layer having an impurity concentration higher than that of the drift layer, and interposed between the drift layer and the second semiconductor layer, and an impurity layer having the second conductivity type is formed on a bottom part of the drift layer in the guard ring region.

A semiconductor device according to a third aspect of the present invention includes a first semiconductor layer having a first conductivity type, a second semiconductor layer arranged under the first semiconductor layer and having the first conductivity type having an impurity concentration higher than that of the first semiconductor layer, a diode cell having an anode layer formed in the first semiconductor layer and having a second conductivity type, and a cathode layer provided as the second semiconductor layer, a cathode electrode arranged on a lower surface of the second semiconductor layer, and a guard ring region provided around a cell region having the diode cell, and having a guard ring formed in the first semiconductor layer, wherein the cathode electrode has been removed from a lower part of the guard ring region.

A semiconductor device according to a fourth aspect of the present invention includes a first semiconductor layer having a first conductivity type, a second semiconductor layer arranged under the first semiconductor layer and having the first conductivity type having an impurity concentration higher than that of the first semiconductor layer, a diode cell having an anode layer formed in the first semiconductor layer and having a second conductivity type, and a cathode layer provided as the second semiconductor layer, a cathode electrode arranged on a lower surface of the second semiconductor layer, and a guard ring region provided around a cell region having the diode cell, and having a guard ring formed in the first semiconductor layer, wherein an impurity layer having the second conductivity type is formed on a bottom part of the first semiconductor layer in the guard ring region.

According to the first to third aspects of the present invention, the carriers are prevented from being accumulated in the guard ring region of the semiconductor device. Thus, the current is prevented from being concentrated in the outer peripheral part of the cell region at the time of the turn-off operation, so that withstand voltage performance is improved in the semiconductor device.

In addition, according to the second and fourth aspects of the present invention, the electric field can be prevented from being concentrated in the upper surface of the guard ring region in the semiconductor device, so that a width of the guard ring region can be small.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
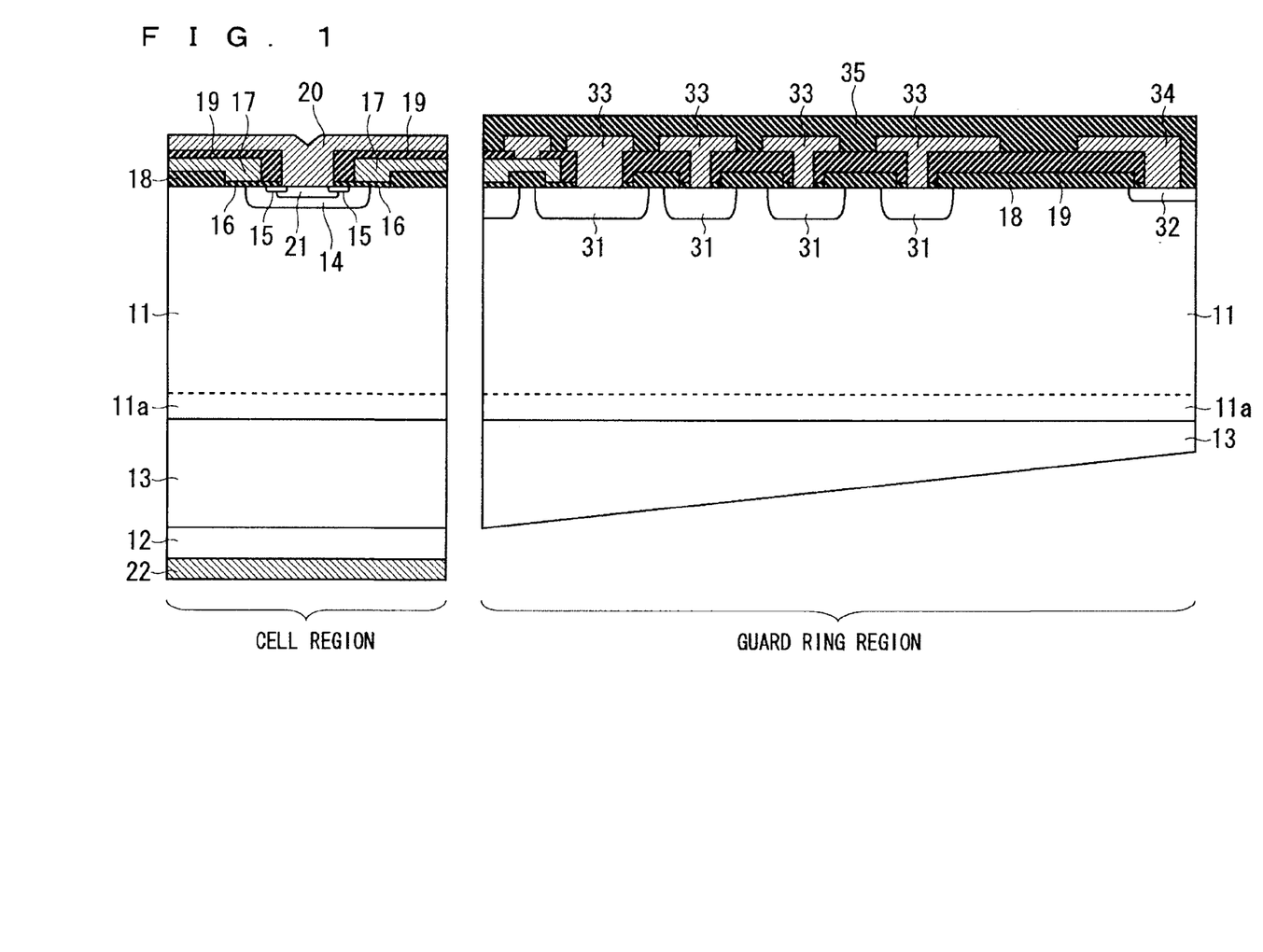
FIG. 1 is a partial cross-sectional view showing a configuration of a semiconductor device according to a first preferred embodiment.

FIG. 1 is a partial cross-sectional view schematically showing a configuration of an IGBT serving as a semiconductor device according to a first preferred embodiment of the present invention. The semiconductor device includes a cell region in which an IGBT cell is arranged, and a guard ring region provided in a peripheral part of a chip around the cell region.

The semiconductor device has a drift layer 11 and a buffer layer 13 serving as an n type semiconductor layer (first semiconductor layer), and a p type collector layer 12 (second semiconductor layer) arranged under them. The buffer layer 13 is the n type region having an impurity concentration higher than that of the n− type drift layer 11. In addition, a lifetime killer layer 11a is formed in a bottom part of the drift layer 11 (in the vicinity of the buffer layer 13). The lifetime killer layer 11a is formed by irradiation of hydrogen ions.

A base region 14 serving as a p type well is selectively formed in an upper surface part of the drift layer 11, and an n type emitter region 15 is formed in an upper part of the base region 14. In addition, a gate insulation film 16 is formed so as to cover the emitter region 15, the base region 14, and the drift layer 11. A gate electrode 17 made of a material such as polysilicon is formed thereon. An upper surface of the drift layer 11 between the cells is covered with an oxide film 18 ($SiO_2$), and a wiring connected to the gate electrode 17 is provided thereon.

An upper part of the gate electrode 17 is covered with an interlayer insulation film 19 made of a material such as PSG (Phospho-Silicate-Glass). A contact hole is formed in the interlayer insulation film 19 and connected to an upper surface of the emitter region 15, and an emitter electrode 20 (having a laminated structure of Al—Si) is formed in the contact hole. While the emitter electrode 20 is also connected to the base region 14, a p+ type contact region 21 is formed in a contact region of the base region 14 with the emitter electrode 20 in order to reduce connection resistance between the emitter electrode 20 and the base region 14.

A collector electrode 22 is formed on a lower surface of the collector layer 12.

Meanwhile, in the guard ring region, at least one p type guard ring 31 is arranged in an upper surface part of the drift layer 11. In addition, an n+ type channel stopper layer 32 is formed in a chip outer peripheral part of the upper surface part of the drift layer 11. A guard ring electrode 33 serving as a field plate is connected to an upper surface of the guard ring 31, and a stopper electrode 34 is connected to an upper surface of the channel stopper layer 32. The guard ring electrode 33 and the stopper electrode 34 can be formed of the same wiring layer as that of the emitter electrode 20 in the cell region. In addition, the guard ring region is covered with an overcoat film 35 made of a material such sin-SiN (semi-insulating Silicon Nitride).

According to this preferred embodiment, a lower surface of the guard ring region is provided with a mesa structure formed by removing the collector layer 12 and the collector electrode 22. This mesa structure is formed such that a structure body (FIG. 2) having the collector layer 12 and the collector electrode 22 on its whole lower surface of the chip is formed on a wafer and then subjected to chip dicing with a dicing blade having a specific shape. Alternatively, the mesa structure can be formed by etching.

In addition, since a relatively strong electric field is generated on the inner side (close to the center of the chip) of the guard ring region, it is necessary to ensure a sufficient thickness of the chip at that part. Therefore, the mesa structure preferably has a sloped bottom surface such that the thickness increases toward the inner side of the guard ring region as shown in FIG. 1.

Hereinafter, a description will be made of a switching operation of the IGBT according to this preferred embodiment shown in FIG. 1.

First, a turn-on operation will be described. When a predetermined voltage is applied to the gate electrode 17, a channel is formed in the base region 14 under the gate electrode 17, and electrons are injected from the emitter region 15 into the drift layer 11 through the channel.

Then, a forward biased state is provided between the collector layer 12 and the emitter electrode 20, and holes are injected from the collector layer 12 into the drift layer 11 through the buffer layer 13. In the cell region, the electrons and the holes are held in equilibrium, and conductivity modulation is generated. Meanwhile, in the guard ring region, since the collector layer 12 and the collector electrode 22 have been removed, the hole injection is not generated.

Figure 2:
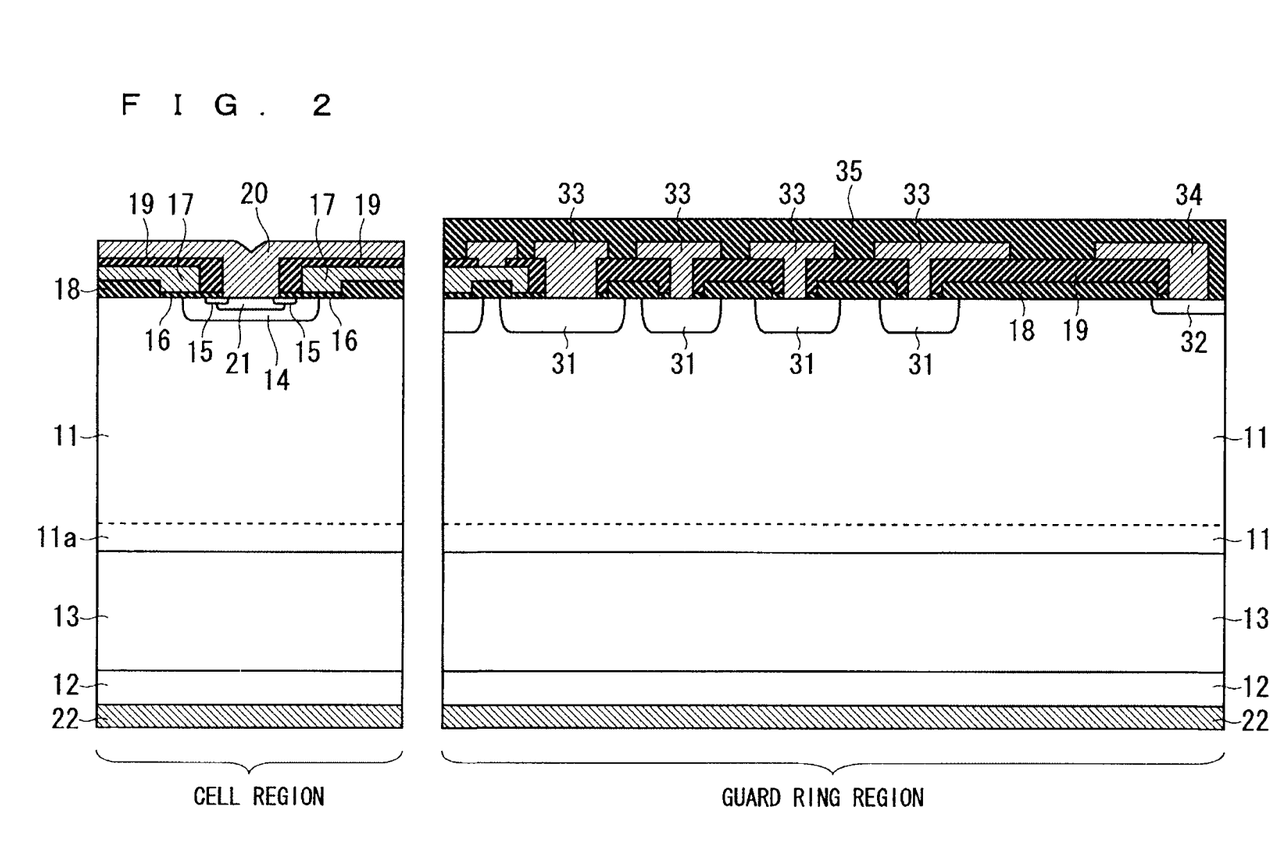
FIG. 2 is a comparison example to explain an effect of the semiconductor device according to the first preferred embodiment.

FIG. 2 is a comparison example to explain an effect of the semiconductor device according to the first preferred embodiment. A semiconductor device shown in FIG. 2 is the same as that shown in FIG. 1 except that a lower surface of a guard ring region does not have the mesa structure (the collector layer 12 and the collector electrode 22 are formed on the lower surface of the guard ring region). Thus, many holes are injected from the collector electrode 22 into the drift layer 11 in the guard ring region in the configuration shown in FIG. 2.

Next, a turn-off operation of the semiconductor device shown in FIG. 1 will be described. At the time of the turn-off operation, the gate electrode 17 is reversely biased, and the electron injection to the drift layer 11 is stopped. In the drift layer 11 in the cell region, the holes remaining in the vicinity of the buffer layer 13 is trapped by the lifetime killer layer 11a, the holes remaining in the vicinity of the upper surface of the drift layer 11 is absorbed into the base region 14 near the emitter region 15, and the rest disappear by its natural lifetime.

Meanwhile, in the guard ring region, since the emitter region 15 is not provided on the upper side of the drift layer 11, the holes remaining in the vicinity of the upper surface of the drift layer 11 try to flow into the base region 14 of the IGBT cell provided in an outermost periphery in the cell region.

As described above, in the case of the semiconductor device shown in FIG. 1, since the holes are not injected from the lower surface into the drift layer 11 in the guard ring region, an amount of the hole remaining in the drift layer 11 is small in the guard ring region. Thus, a small amount of holes flows out of the drift layer 11 in the guard ring region toward the base region 14 provided in the outermost periphery in the cell region.

Meanwhile, since the collector layer 12 and the collector electrode 22 are formed on the lower part of the guard ring region as shown in FIG. 2, many holes are injected into the drift layer 11 in the guard ring region at the time of the turn-on operation, so that a large amount of holes flows into the base region 14 provided in an outermost periphery in the cell region at the time of the turn-off operation. When a current due to these holes exceeds a certain value, thermal destruction is caused in that part, and cutoff destruction withstand capability is lowered in the IGBT.

Thus, in the case of the semiconductor device shown in FIG. 1, the amount of holes injected into the drift layer 11 is small in the guard ring region at the time of the turn-on operation, so that a current is prevented from being concentrated in the base region 14 provided in the outermost periphery in the cell region at the time of the turn-off operation. Therefore, the thermal destruction can be prevented from being generated in the base region 14 provided in the outermost periphery in the cell region, and the cutoff destruction withstand capability can be improved in the IGBT, so that a larger RBSOA can be ensured.

Second Preferred Embodiment

Figure 3:
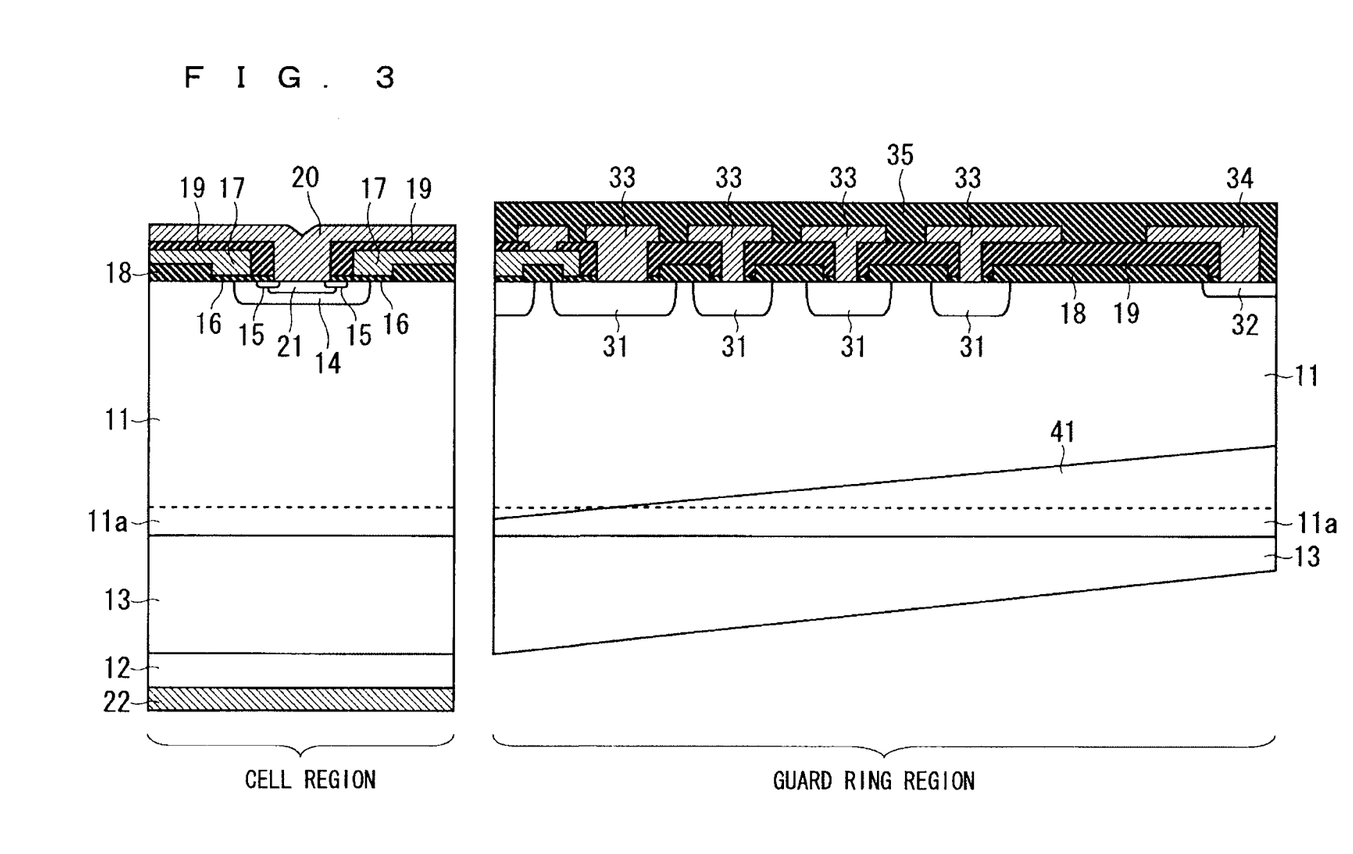
FIG. 3 is a partial cross-sectional view showing a configuration of a semiconductor device according to a second preferred embodiment.

FIG. 3 is a partial cross-sectional view showing a configuration of a semiconductor device according to a second preferred embodiment. This semiconductor device differs from the configuration shown in FIG. 1 in that a p type layer 41 (impurity layer) is formed in a bottom part of a drift layer 11 in a guard ring region. A lower surface of the guard ring region has the same mesa structure as that of the first preferred embodiment, and a collector layer 12 and a collector electrode 22 have been removed.

A structure in FIG. 3 can be formed by the following steps. First, a structure body (FIG. 2) having the collector layer 12 and the collector electrode 22 on its whole lower surface of a chip is formed on a wafer. Then, the mesa structure is formed in the wafer (before dicing) by grinding the lower surface of the guard ring region with a blade having a V-shaped cross section, and a mask having an opening which corresponds to the guard ring region in each chip is formed on a lower surface of the wafer by a double-sided aligner. Thus, high-concentration p type dopant ions (such as phosphorus) are injected from the lower surface of the wafer into the bottom part of the drift layer 11 in the guard ring part, and the resultant is activated by a heat treatment, whereby the p type layer 41 is formed.

Similar to the first preferred embodiment, in the case of the semiconductor device in this preferred embodiment, the hole is not introduced from the lower surface of the drift layer 11 into the guard ring region, which prevents a large amount of holes from flowing into a base region 14 provided in an outermost periphery in a cell region at the time of a turn-off operation, and cutoff destruction withstand capability is improved. Furthermore, because the p type layer 41 is provided on the bottom part of the drift layer 11 in the guard ring region, an electric field spreads toward the lower surface side of the drift layer 11, so that the electric field is prevented from being concentrated in an upper surface part. As a result, a width of the guard ring region can be smaller than the conventional example.

In addition, as shown in FIG. 3, it is preferable that a thickness of the p type layer 41 increases toward the outer periphery side of the chip. That is, it is preferable that an injection depth of the p type dopant from the back surface to form the p type layer 41 increases toward the chip outer periphery side with respect to the bottom surface of the drift layer 11. Thus, the electric field is more prevented from being concentrated in the guard ring region, and the width of the guard ring region can be even smaller.

Third Preferred Embodiment

Figure 4:
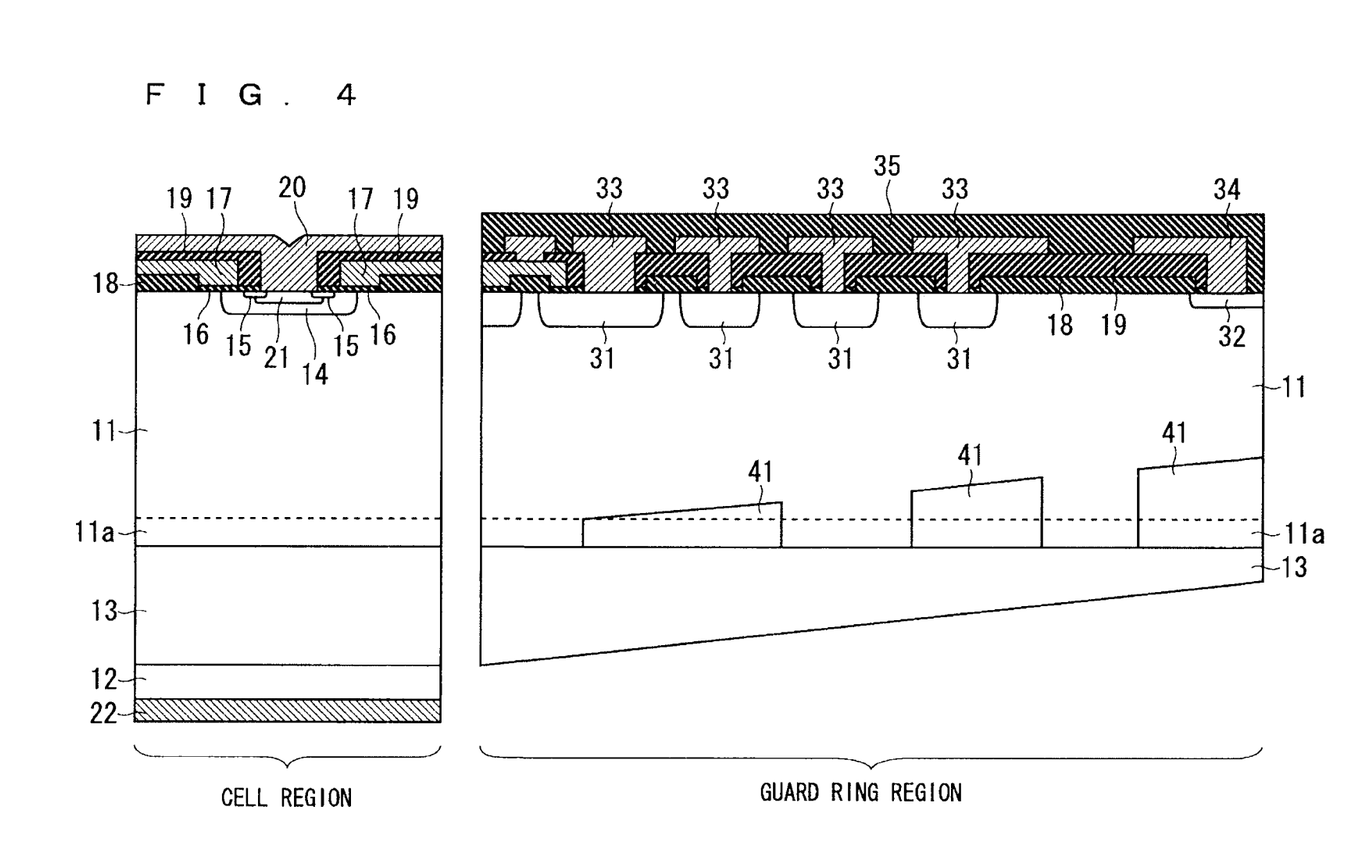
FIG. 4 is a partial cross-sectional view showing a configuration of a semiconductor device according to a third preferred embodiment.

FIG. 4 is a partial cross-sectional view showing a configuration of a semiconductor device according to a third preferred embodiment. The semiconductor device differs from the configuration shown in FIG. 3 in that a plurality of p type layers 41 are separately provided in a bottom part of a drift layer 11 in a guard ring region. In other words, the p type layers 41 are aligned in a direction from an inner periphery to an outer periphery in the guard ring region.

The p type layers 41 can be separately formed in such a manner that high-concentration phosphorus ions are injected into the bottom part of the drift layer 11 in the guard ring region by the same method as that of the second preferred embodiment, and subjected to a heat treatment such as laser annealing.

In the case of the semiconductor device of this preferred embodiment, in addition to the same effect as that of the second preferred embodiment, an electric field distribution can be optimized in the guard ring region because the p type layers 41 are separately provided. Therefore, an electric field is more prevented from being concentrated in the drift layer 11 than the second preferred embodiment, so that a width of the guard ring region can be even smaller.

Fourth Preferred Embodiment

Figure 5:
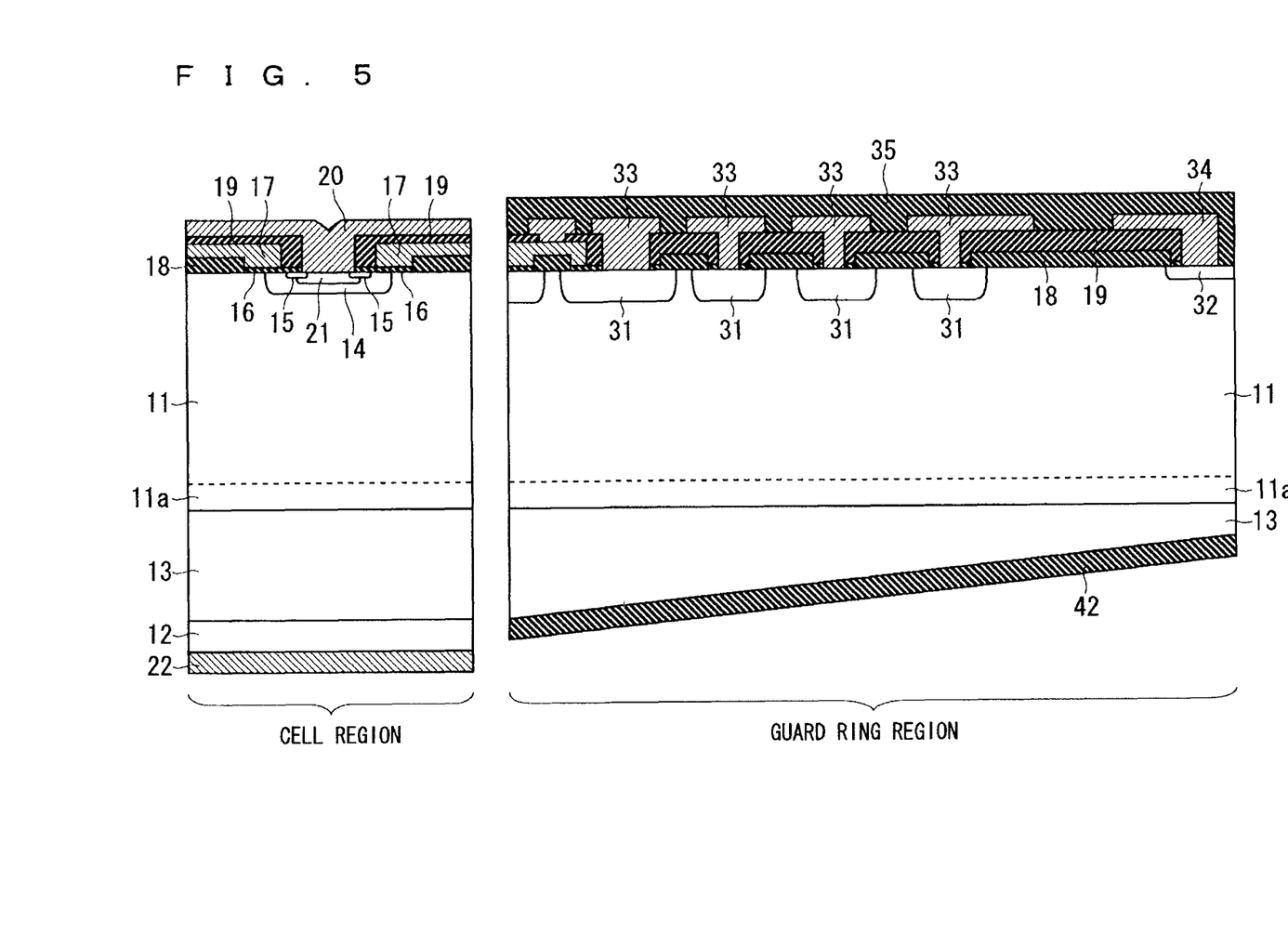
FIG. 5 is a partial cross-sectional view showing a configuration of a semiconductor device according to a fourth preferred embodiment.

FIG. 5 is a partial cross-sectional view showing a configuration of a semiconductor device according to a fourth preferred embodiment. The semiconductor device differs from the configuration shown in FIG. 1 in that a protection film 42 is formed on a lower surface (surface of a mesa structure) of a guard ring region.

This structure can be formed by the following steps. First, a structure body (FIG. 2) having a collector layer 12 and a collector electrode 22 on its whole lower surface of a chip is formed on a wafer. Then, the mesa structure is formed in the wafer (before dicing) by grinding the lower surface of the guard ring region with a blade having a V-shaped cross section. Then, an organic material (such as polyimide) is applied to the grinded surface and baked to become solid, whereby the protection film 42 is formed.

In the case of the semiconductor device in this preferred embodiment, cutoff destruction withstand capability is improved similar to the first preferred embodiment, and since the protection film 42 is provided on the lower surface of the guard ring, insulation withstand capability can be improved.

In addition, this preferred embodiment can be applied to the second and third preferred embodiments. That is, the protection film 42 may be provided on the lower surfaces of the guard ring regions shown in FIG. 3 and FIG. 4.

Fifth Preferred Embodiment

Figure 6:
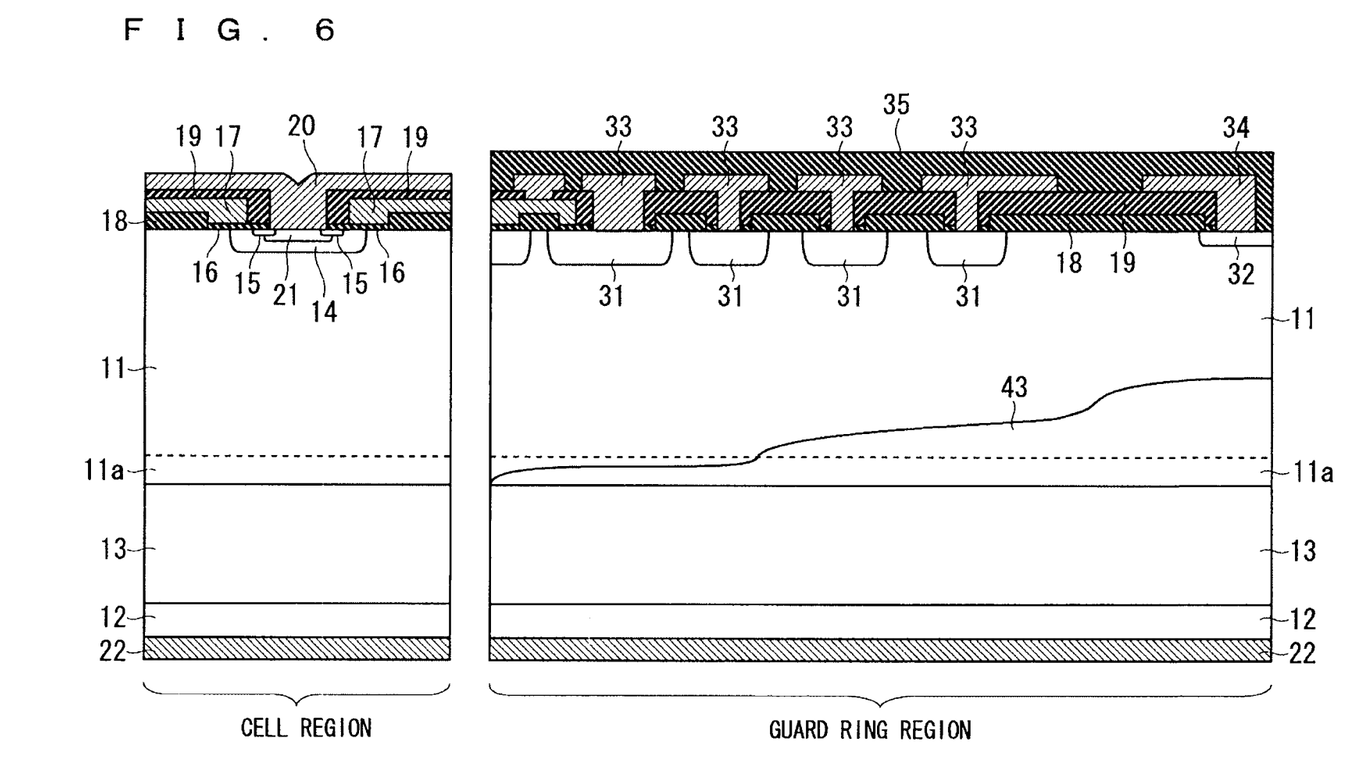
FIG. 6 is a partial cross-sectional view showing a configuration of a semiconductor device according to a fifth preferred embodiment.

FIG. 6 is a partial cross-sectional view showing a configuration of a semiconductor device according to a fifth preferred embodiment. The semiconductor device is provided in such a manner that a lower surface of a guard ring region does not have a mesa structure, and a p type layer 43 is formed on a bottom surface of a drift layer 11 in the guard ring region. As shown in FIG. 6, the p type layer 43 is formed such that its thickness (depth from the lower surface) is larger in an outer peripheral part than in an inner peripheral part in the guard ring region.

This structure can be formed by the following steps. First, a structure body (FIG. 2) having a collector layer 12 and a collector electrode 22 on its whole lower surface of a chip is formed on a wafer. A mask having an opening which corresponds to the guard ring region in each chip is formed on a lower surface of the wafer by a double-sided aligner. Then, high-concentration p-type dopant ions (such as phosphorus) are injected from the lower surface of the wafer into the bottom part of the drift layer 11 in the guard ring part. The ion injection at this time is performed two times or more with acceleration varied so that an injection depth of phosphorus becomes greater in the outer peripheral part than the inner peripheral part in the guard ring region. Then, a heat treatment is performed to activate the ions, whereby the p type layer 43 is formed.

In the case of the semiconductor device in this preferred embodiment, because the p type layer 43 is formed on the bottom part of the drift layer 11 in the guard ring region, an electric field spreads toward the lower surface side of the drift layer 11, so that the electric field is prevented from being concentrated in an upper surface part. In addition, as shown in FIG. 6, since the thickness of the p type layer 43 increases toward the outer peripheral side of the chip, the electric field can be effectively prevented from being concentrated. As a result, a width of the guard ring region can be smaller than that of the conventional example.

In addition, the third preferred embodiment may be applied to this preferred embodiment such that the p type layers 43 are separately formed. Thus, electric field distribution can be optimized in the guard ring region, so that the width of the guard ring region can be even smaller.

Sixth Preferred Embodiment

Figure 7:
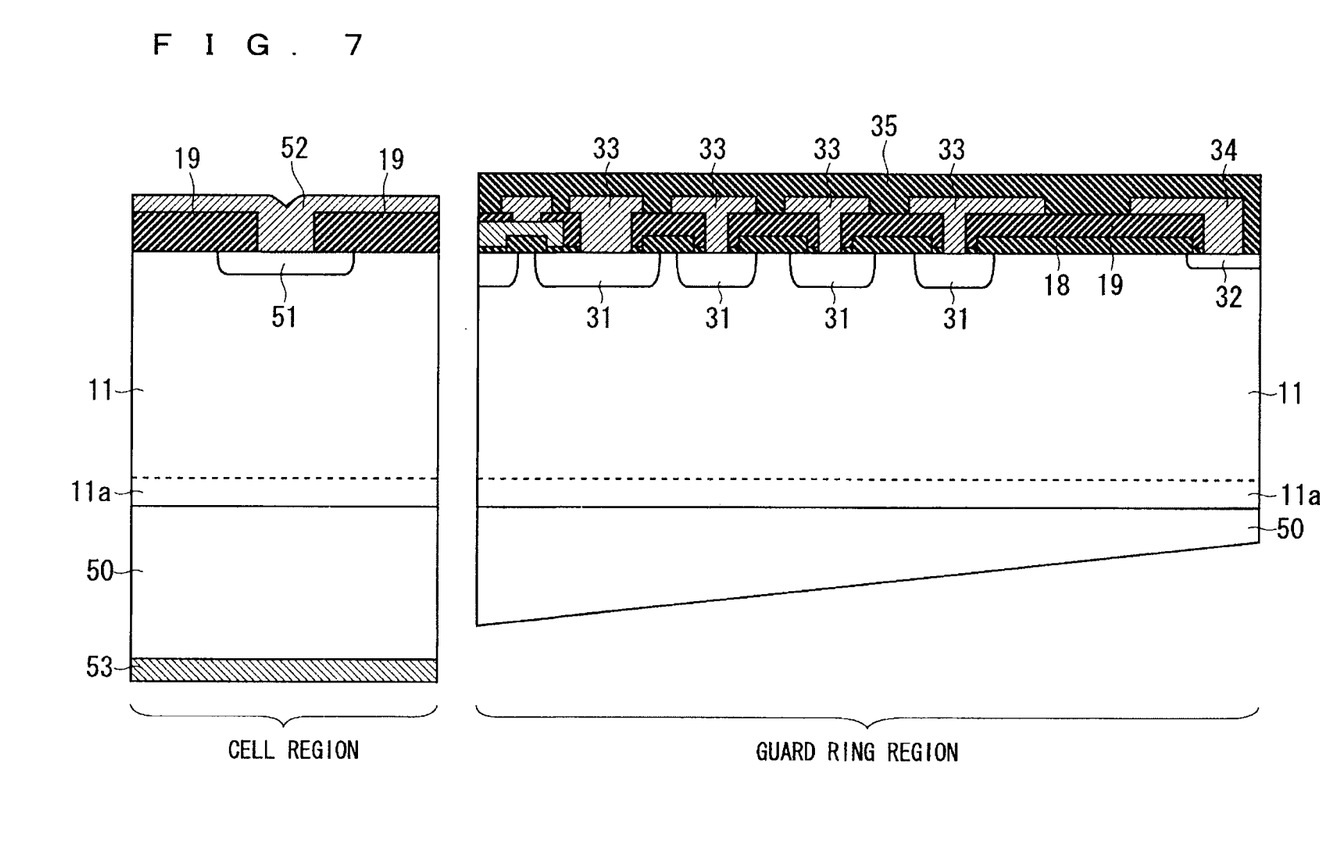
FIG. 7 is a partial cross-sectional view showing a configuration of a semiconductor device according to a sixth preferred embodiment.

In a sixth preferred embodiment, the present invention is applied to a PiN diode. FIG. 7 is a partial cross-sectional view showing a configuration of a semiconductor device according to the sixth preferred embodiment. In this drawing, an element having the same function as that shown in FIG. 1 is marked with the same reference and its description is omitted.

The semiconductor device includes an n– type drift layer 11 (first semiconductor layer), and an n type cathode layer 50 arranged under the n– type drift layer 11 and having an impurity concentration higher than that of the drift layer 11. In addition, a lifetime killer layer 11a is formed on a bottom part of the drift layer 11 (near the cathode layer 50).

In a cell region, an anode layer 51 serving as a p type well is formed in an upper surface part of the drift layer 11, and an anode electrode 52 is connected to its upper surface. The n– region of the drift layer 11 functions as an i layer (intrinsic semiconductor layer). In addition, a cathode electrode 53 is formed on a lower surface of the cathode layer 50.

A configuration of a guard ring region is the same as that shown in FIG. 1. A guard ring electrode 33 and a stopper electrode 34 can be formed of the same wiring layer as that of the anode electrode 52. In addition, similar to FIG. 1, the guard ring region has a mesa structure on the lower surface side, and the cathode electrode 53 and the cathode layer 50 has been partially removed in the guard ring region.

When the diode is in on state, holes are injected from the anode layer 51 provided on the upper surface side of the cell region, into the drift layer 11, and electrons are injected from the cathode electrode 53 provided on the lower surface side thereto through the cathode layer 50. Here, it is to be noted in this preferred embodiment that since the anode electrode 52 is not provided on the lower surface of the guard ring region, electrons are not injected from the lower part of the guard ring region to the drift layer 11. Thus, a small amount of holes flows from the cell region into the drift layer 11 in the guard ring region.

Thus, when the diode is turned off, the electrons stored in the drift layer 11 during the on state is discharged to the cathode electrode 53, and the holes are discharged to the anode layer 51. In addition, a part of the electrons and holes are recoupled and disappear. At this time, the holes stored in the drift layer 11 in the guard ring region flows into the anode layer 51 provided in an outermost periphery in the cell region. However, the small amount of the holes has flowed into the drift layer 11 during the on state, so that an amount of the holes flowing into the drift layer 11 at the time of the turn-off operation is small. Thus, a reverse recovery current is prevented from being concentrated in an outer periphery in the cell region, so that reverse recovery withstand capability is improved in the diode.

While the first preferred embodiment is applied to the diode here, the second to fifth preferred embodiments may be applied to the diode. When the p type layer 41 (FIGS. 3 and 4) or the p type layer 43 (FIG. 6) is provided on the bottom part of the drift layer 11 in the guard ring region of the diode, an electric field spreads toward the lower surface side of the drift layer 11, so that the electric field can be prevented from being concentrated in the upper surface part. In addition, when the protection film 42 (FIG. 5) is provided on the surface of the mesa structure, insulation withstand capability can be improved in the diode.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a first semiconductor layer having a first conductivity type;
    a second semiconductor layer arranged under said first semiconductor layer and having a second conductivity type;
    an IGBT cell having a base region and an emitter region formed in said first semiconductor layer, and a collector layer provided as said second semiconductor layer; and
    a guard ring region provided around a cell region having said IGBT cell, and having a guard ring formed in said first semiconductor layer, wherein
    said first semiconductor layer comprises:
    a drift layer; and
    a buffer layer having an impurity concentration higher than that of said drift layer, and interposed between said drift layer and said second semiconductor layer, and
    an impurity layer having said second conductivity type is formed on a bottom part of said drift layer in said guard ring region.

2. The semiconductor device according to claim 1, wherein a thickness of said impurity layer increases toward an outer periphery of a chip.

3. The semiconductor device according to claim 1, wherein said impurity layer is divided into at least two parts.

* * * * *